(12) United States Patent
Yip et al.

(10) Patent No.: US 7,566,648 B2
(45) Date of Patent: Jul. 28, 2009

(54) METHOD OF MAKING SOLDER PAD

(75) Inventors: Heng Keong Yip, Subang Jaya (MY); Thoon Khin Chang, Kuala Lumpur (MY); Chee Seng Foong, Sg. Buloh (MY)

(73) Assignee: Freescale Semiconductor Inc., Austin, TX (US)

( * ) Notice: Subject to any disclaimer, the term of this patent is extended or adjusted under 35 U.S.C. 154(b) by 8 days.

(21) Appl. No.: 11/738,514

(22) Filed: Apr. 22, 2007

(65) Prior Publication Data

US 2008/0258297 A1    Oct. 23, 2008

(51) Int. Cl.
*H01L 21/44* (2006.01)

(52) U.S. Cl. .......... 438/612; 438/107; 438/112; 438/121; 438/124; 438/638; 257/E21.476

(58) Field of Classification Search .......... 438/456, 438/612, 613, 669, 687, 700, 702, 703, 942, 438/FOR. 132, FOR. 133
See application file for complete search history.

(56) References Cited

U.S. PATENT DOCUMENTS

| | | | |
|---|---|---|---|
| 6,803,302 B2 | 10/2004 | Pozder et al. | |
| 6,846,717 B2 | 1/2005 | Downey et al. | |
| 6,921,979 B2 | 7/2005 | Downey et al. | |
| 6,924,172 B2 | 8/2005 | Roche et al. | |
| 6,937,047 B2 | 8/2005 | Tran et al. | |
| 7,042,098 B2 | 5/2006 | Harun et al. | |
| 7,078,796 B2 | 7/2006 | Dunn et al. | |
| 7,169,694 B2 | 1/2007 | Pozder et al. | |
| 2001/0016981 A1* | 8/2001 | Ziemkowski | 29/830 |
| 2003/0141103 A1 | 7/2003 | Ng et al. | |
| 2005/0023704 A1* | 2/2005 | Lin et al. | 257/781 |
| 2005/0035441 A1* | 2/2005 | Lee et al. | 257/686 |
| 2005/0221635 A1 | 10/2005 | Brody et al. | |
| 2006/0076671 A1* | 4/2006 | Kariya et al. | 257/702 |

* cited by examiner

*Primary Examiner*—N Drew Richards
*Assistant Examiner*—Kyoung Lee
(74) *Attorney, Agent, or Firm*—Charles Bergere

(57) ABSTRACT

A method of making a solder pad includes providing a substrate having a metal layer formed on it, and applying a photo resist to the metal layer. The photo resist is patterned. A first etching operation is performed on the metal layer to form voids in the metal layer. A second etching operation is performed on the metal layer to form the solder pad. A solder mask is formed on the substrate and a portion of the solder pad.

14 Claims, 6 Drawing Sheets

METHOD OF MAKING SOLDER PAD

BACKGROUND OF THE INVENTION

The present invention relates to integrated circuits, and more particularly, to a method of making a solder pad for an integrated circuit.

Solder pads provide both electrical and mechanical connections, as well as a thermal path, between electronic components. Typically, solder balls or bumps are deposited onto the solder pads and reflowed to form respective solder joints between the electronic components. A conventional method of making a solder pad 10 will now be described with reference to FIGS. 1 through 4. Referring now to FIG. 1, a substrate 12 having a metal layer 14 formed thereon is shown. A photo resist 16 is applied to the metal layer 14 and exposed through a photo mask 18 placed over the photo resist 16. Referring now to FIG. 2, the photo mask 18 is removed after exposure and the photo resist 16 is developed, exposing portions 20 of the metal layer 14. Referring now to FIG. 3, the metal layer 14 is selectively etched through the developed photo resist 16 to form the solder pad 10. As shown in FIG. 3, portions 22 of the substrate 12 are exposed by the etching operation. Referring now to FIG. 4, a solder mask 24 is formed on the exposed portions 22 of the substrate 12 and a portion 26 of the solder pad 10. A solder ball or bump 28 is deposited on the solder pad 10. Because the reliability of the solder joints formed between the electronic components is dependent on the adhesion of the solder ball 28 to the solder pad 10, there is a need for strong adhesion between the solder pad 10 and the solder ball 28 deposited thereon.

It would be desirable to have a method of making a solder pad that enhances adhesion of the solder ball to the solder pad.

BRIEF DESCRIPTION OF THE DRAWINGS

The following detailed description of a preferred embodiment of the invention will be better understood when read in conjunction with the appended drawings. The present invention is illustrated by way of example and is not limited by the accompanying figures, in which like references indicate similar elements. It is to be understood that the drawings are not to scale and have been simplified for ease of understanding the invention.

DETAILED DESCRIPTION OF THE PREFERRED EMBODIMENTS

Figure 1:
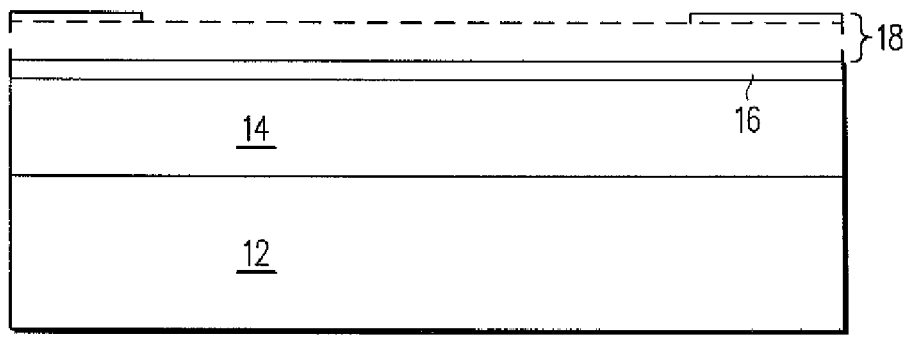
FIGS. 1 through 4 illustrate a conventional method of making a solder pad.
Figure 2:
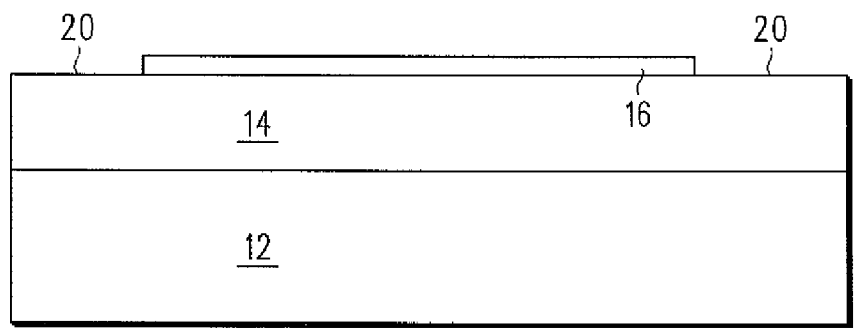
Figure 3:
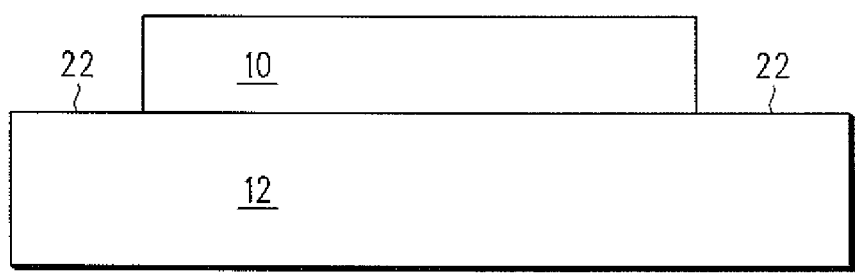
Figure 4:
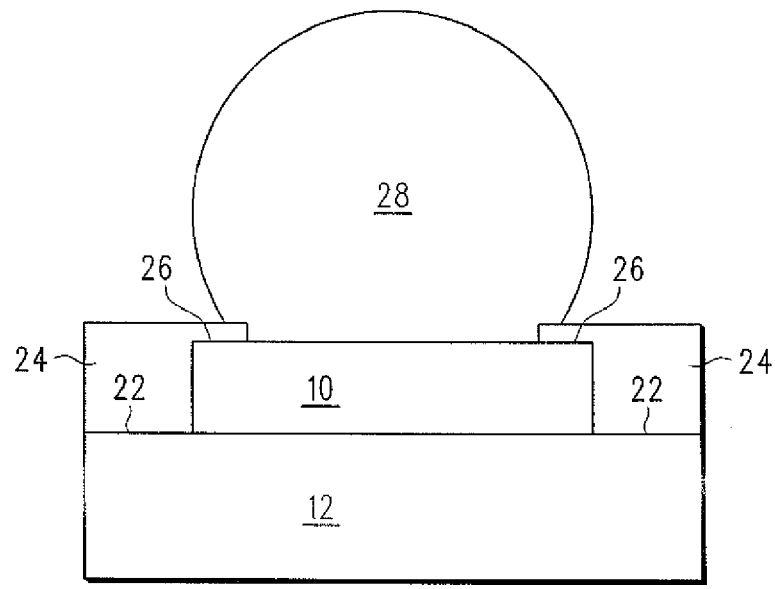

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention. In the drawings, like numerals are used to indicate like elements throughout.

The present invention provides a method of making a solder pad including the step of providing a substrate having a metal layer formed thereon. A photo resist is applied to the metal layer and patterned. A first etching operation is performed on the metal layer to form a plurality of voids in the metal layer. A second etching operation is performed on the metal layer to form the solder pad. A solder mask is formed on the substrate and a portion of the solder pad. The present invention also provides a solder pad made in accordance with the method described above.

The present invention further provides a method of making a solder pad including the step of providing a substrate having a metal layer formed thereon. A first photo resist is applied to the metal layer and patterned. A first etching operation is performed on the metal layer to form a plurality of voids in the metal layer. A second photo resist is applied to the metal layer and patterned. A second etching operation is performed on the metal layer to form the solder pad. A solder mask is formed on the substrate and a portion of the solder pad.

The present invention also provides a method of making a solder pad including the step of providing a substrate having a metal layer formed thereon. A first photo resist is applied to the metal layer. The first photo resist is exposed through a first photo mask and developed. A first etching operation is performed on the metal layer to form a plurality of voids in the metal layer. A second photo resist is applied to the metal layer. The second photo resist is exposed through a second photo mask and developed. A second etching operation is performed on the metal layer to form the solder pad. A solder mask is formed on the substrate and a portion of the solder pad.

FIGS. 5 through 12 illustrate a method of making a solder pad 50 in accordance with an embodiment of the present invention.

Figure 5:
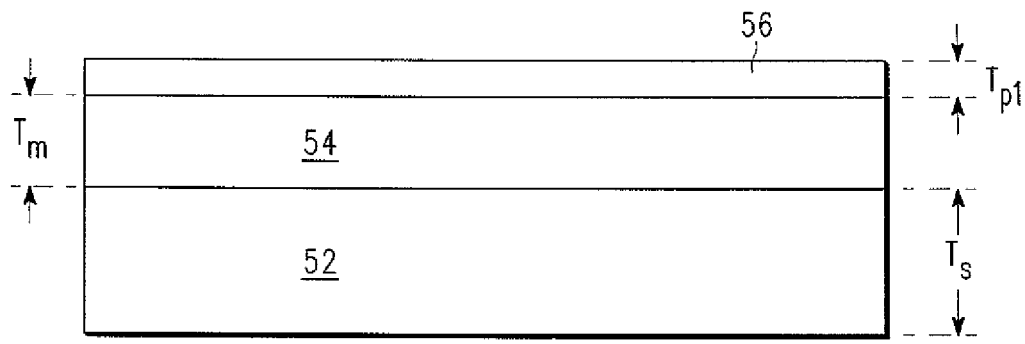
FIG. 5 is an enlarged cross-sectional view of a substrate having a metal layer formed thereon in accordance with an embodiment of the present invention.

Referring now to FIG. 5, a substrate 52 having the metal layer 54 formed thereon is provided as shown. A first photo resist 56 is applied to the metal layer 54. The substrate 52 may be a bismaleimide-triazine (BT) substrate, as is commonly used in semiconductor packaging. The metal layer 54 is formed on the substrate 52 via a well known metal deposition process such as, for example, sputtering or vacuum evaporation. In one embodiment, the metal layer 54 comprises copper (Cu). The first photo resist 56 may be any known photo resist material and is applied to the metal layer 54 using a well known photo resist application technique such as roll coating in the case of a dry film resist. In one embodiment, the substrate 52 has a thickness $T_s$ of about 0.2 to 0.60 millimeters (mm), the metal layer 54 has a thickness $T_m$ of about 0.05 mm, and the first photo resist 56 has a thickness $T_{p1}$ of about 0.10 mm.

Figure 6:
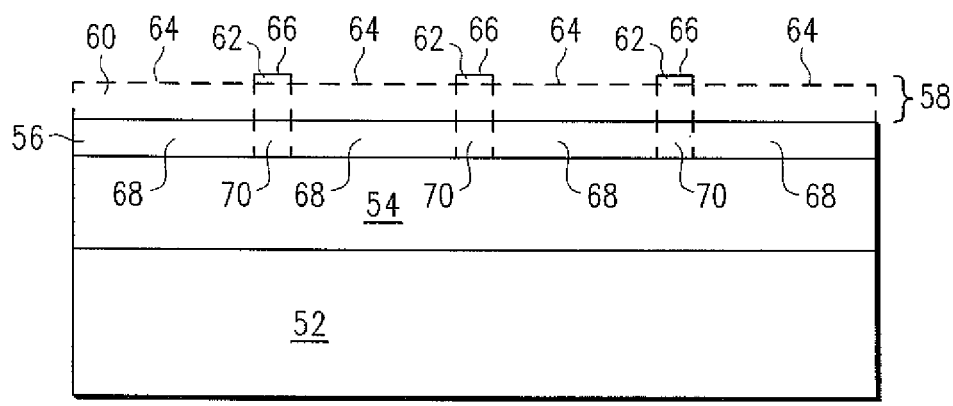
FIG. 6 is an enlarged cross-sectional view of a first photo mask placed over a first photo resist applied to the metal layer of FIG. 5.
Figure 7:
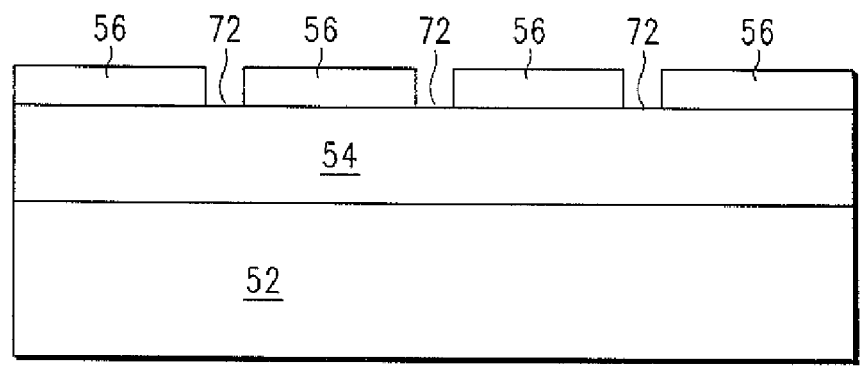
FIG. 7 is an enlarged cross-sectional view of the first photo resist of FIG. 6 after a patterning operation.

FIGS. 6 and 7 illustrate a patterning process performed on the first photo resist 56.

Referring now to FIG. 6, a first photo mask 58 is placed over the first photo resist 56 as shown. The first photo resist 56 is exposed through the first photo mask 58.

The first photo mask 58 comprises a transparent plate 60 (defined by dashed lines) of glass or quartz, for example, on which a first pattern to be transferred onto the metal layer 54 is formed using an opaque material 62 such as, for example, chrome. Accordingly, a top surface of the first photo mask 58 comprises transparent areas 64 (defined by dashed lines) and opaque areas 66 (defined by solid lines). The transparent and opaque areas 64 and 66 on the top surface of the first photo mask 58 define the first pattern to be formed in the metal layer 54.

Depending on the type of photo resist used, the first photo resist 56 is exposed to either ultraviolet (UV) light or laser generated light. In the embodiment shown, the first photo resist 56 is a negative-working photo resist, that is, exposed portions 68 of the first photo resist 56 polymerize or harden when irradiated. Unexposed portions 70 of the first photo resist 56 do not polymerize and are soluble when immersed in chemical solvents. Nonetheless, those of skill in the art will understand that the present invention is not limited to negative-working photo resists. For example, the first photo resist 56 may instead be a positive-working photo resist whose exposed portions 68 become unpolymerized when irradiated.

Referring now to FIG. 7, the first photo mask 58 is removed and the first photo resist 56 is developed. The unexposed, and therefore unpolymerized, portions 70 of the first photo resist 56 are dissolved away during the development process, thereby forming a negative image of the first photo mask 58 in the first photo resist 56. As shown in FIG. 7, portions 72 of the metal layer 54 are exposed by the development process.

In one embodiment, the first photo resist 56 is developed by passing the substrate 52, the metal layer 54 and the first photo resist 56 between spray banks of a chemical solvent such as, a heated dilute solution of sodium or potassium carbonate. Nonetheless, those of skill in the art will understand that the present invention is not limited to a particular method of developing the first photo resist 56 or by the chemicals used in the development process.

Figure 8:
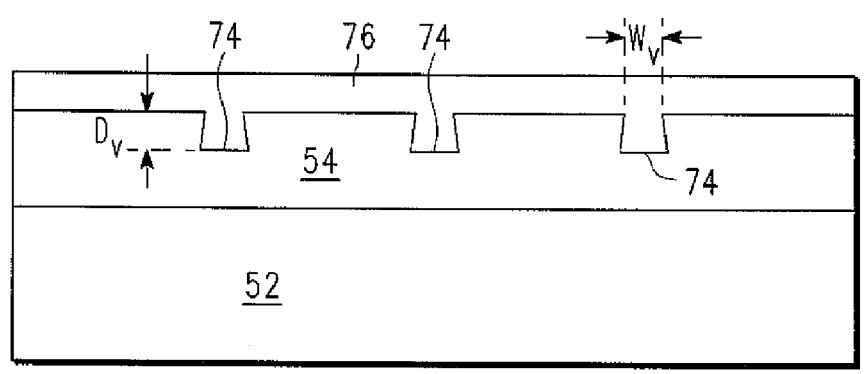
FIG. 8 is an enlarged cross-sectional view of a plurality of voids formed in the metal layer of FIG. 7.

Referring now to FIG. 8, a plurality of voids 74 is formed in the metal layer 54 as shown. The voids 74 are formed by performing a first etching operation on the metal layer 54, and more particularly by half-etching the metal layer 54 through the first photo resist 56. Accordingly, a pattern substantially identical to that of the first photo mask 58 is formed in the metal layer 54. The first photo resist 56 is removed from the metal layer 54 after the first etching operation. A second photo resist 76 is applied to the metal layer 54. As shown in FIG. 8, the second photo resist 76 fills the voids 74 formed in the metal layer 54.

A known etching technique such as, for example, wet etching or dry etching may be used to etch the metal layer 54. In the embodiment shown, the voids 74 have a substantially trapezoidal cross-section. Nonetheless, it will be understood by those of skill in the art that the present invention is not limited by the cross-sectional shape of the voids 74. For example, the voids 74 may have a substantially rectangular cross-section in other embodiments. The voids 74 with the substantially trapezoidal cross-section may be formed by over-etching the metal layer 54. In one embodiment, the voids 74 have a depth $D_v$ of about 0.02 mm and a width $W_v$ of about 0.015 mm.

The first photo resist 56 may be removed from the metal layer 54 using a chemical solvent such as acetone. Such solvents are widely used and commercially available.

The second photo resist 76 may be any known photo resist material and is applied to the metal layer 54 using a well known photo resist application technique such as roll coating in the case of a dry film resist. In one embodiment, the second photo resist 76 has a thickness $T_{p2}$ of about 0.1 mm.

Figure 9:
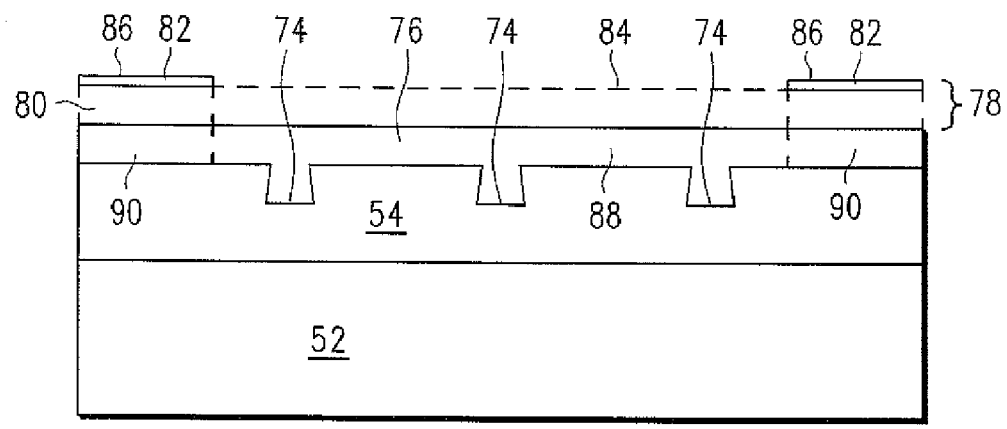
FIG. 9 is an enlarged cross-sectional view of a second photo mask placed over a second photo resist applied to the metal layer of FIG. 8.
Figure 10:
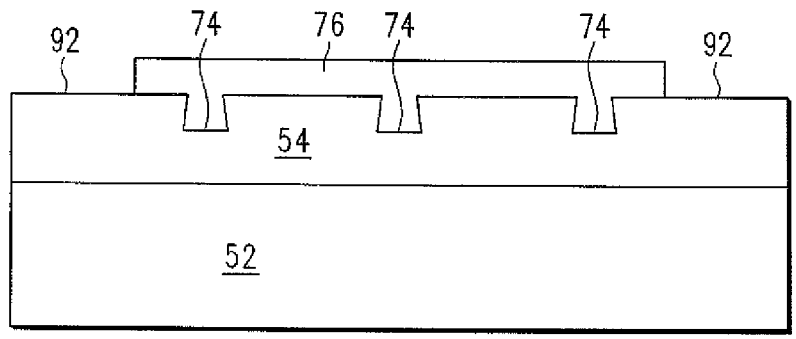
FIG. 10 is an enlarged cross-sectional view of the second photo resist of FIG. 9 after a patterning operation.

FIGS. 9 and 10 illustrate a patterning process performed on the second photo resist 76.

Referring now to FIG. 9, a second photo mask 78 is placed over the second photo resist 76 as shown. The second photo resist 76 is exposed through the second photo mask 78.

The second photo mask 78 comprises a transparent plate 80 (defined by dashed lines) of glass or quartz, for example, on which a second pattern to be transferred onto the metal layer 54 is formed using an opaque material 82 such as, for example, chrome. Accordingly, a top surface of the second photo mask 78 comprises a transparent area 84 (defined by dashed lines) and opaque areas 86 (defined by solid lines). The transparent and opaque areas 84 and 86 on the top surface of the second photo mask 78 define the second pattern to be formed in the metal layer 54.

Depending on the type of photo resist used, the second photo resist 56 is exposed to either ultraviolet (UV) light or laser. In the embodiment shown, the second photo resist 76 is a negative-working photo resist, that is, exposed portions 88 of the second photo resist 76 polymerize or harden when irradiated. Unexposed portions 90 of the second photo resist 76 do not polymerize and are soluble when immersed in chemical solvents. Nonetheless, as previously mentioned, those of skill in the art will understand that the present invention is not limited to negative-working photo resists. In an alternative embodiment, the second photo resist 76 may be a positive-working photo resist whose exposed portions 88 become unpolymerized when irradiated.

Referring now to FIG. 10, the second photo mask 78 is removed and the second photo resist 76 is developed. The unexposed, and therefore unpolymerized, portions 90 of the second photo resist 76 are dissolved away during the development process, thereby forming a negative image of the second photo mask 78 in the second photo resist 76. As shown in FIG. 10, portions 92 of the metal layer 54 are exposed by the development process.

In one embodiment, the second photo resist 76 is developed by passing the substrate 52, the metal layer 54 and the second photo resist 76 between spray banks of a chemical solvent such as, for example, a heated dilute solution of sodium or potassium carbonate. Nonetheless, those of skill in the art will understand that the present invention is not limited to a particular method of developing the second photo resist 76 or by the chemicals used in the development process.

Figure 11:
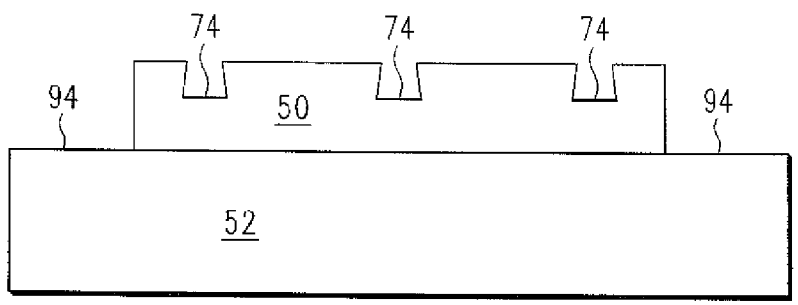
FIG. 11 is an enlarged cross-sectional view of a solder pad formed out of the metal layer of FIG. 10.

Referring now to FIG. 11, a second etching operation is performed on the metal layer 54 to form the solder pad 50. More particularly, the solder pad 50 is formed by etching the metal layer 54 through the second photo resist 76. As shown in FIG. 11, portions 94 of the substrate 52 are exposed by the second etching operation. The second photo resist 76 is removed from the metal layer 54 after the etching operation. A known etching technique such as, for example, wet etching or dry etching may be used to etch the metal layer 54. The second photo resist 76 may be removed with a commercially available chemical solvent such as acetone.

Figure 12:
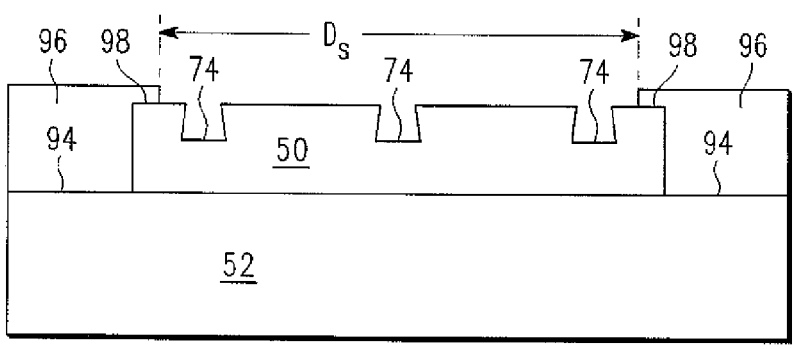
FIG. 12 is an enlarged cross-sectional view of a solder mask formed on the substrate and a portion of the solder pad of FIG. 11.

Referring now to FIG. 12, a solder mask 96 is formed on the exposed portions 94 of the substrate 52 and a portion 98 of the solder pad 50 as shown. Subsequent to the solder masking process, solder material in the form of a solder ball or bump, for example, may be deposited onto the solder pad 50.

The solder mask 96 protects predetermined areas of the substrate 52 from solder deposition, preventing deposition of the solder material onto circuit features other than the solder pad 50. A well known solder mask coating operation such as, for example, screen printing, may be used to form the solder mask 96 on the substrate 52 and the solder pad 50. In one embodiment, the uncovered solder pad 50 has a diameter $D_s$ (or width if rectangular) of about 0.02 mm.

The voids 74 in the solder pad 50 increase the area of contact between the solder pad 50 and the solder material deposited thereon. The increase in contact area enhances adhesion of the solder material to the solder pad 50, thereby reducing the incidence of brittle fracture and solder ball drop. Additionally, the increase in contact area between the solder pad 50 and the solder material also enhances thermal and electrical conductivity between electronic components. Mechanical adhesion of the solder material to the solder pad 50 is further enhanced by the provision of an interlocking mechanism in the form of the substantially trapezoidal cross-section of the voids 74.

Although FIGS. 6 and 9 show the first and second photo resists 56 and 76 being patterned with the first and second photo masks 58 and 78, respectively, it will be understood that the present invention is not limited to patterning methods employing photo masks. In alternative embodiments, the first and second photo resists 56 and 76 may be patterned using a maskless patterning method such as, for example, a patterning method employing an electron beam.

Figure 13:
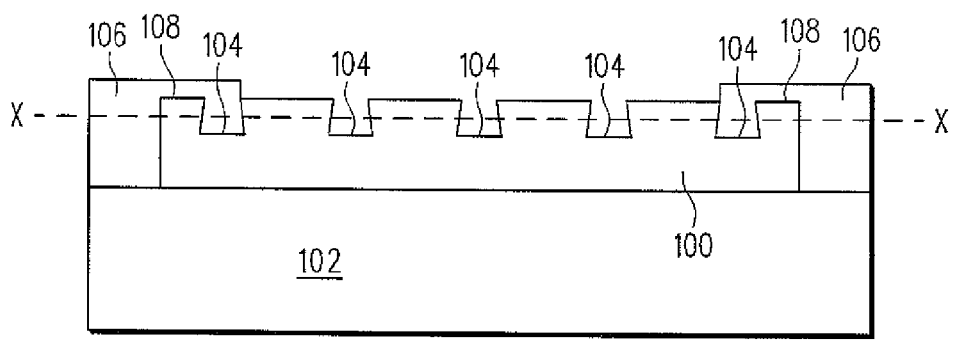
FIG. 13 is an enlarged cross-sectional view of a solder pad made in accordance with another embodiment of the present invention.

Referring now to FIG. 13, an enlarged cross-sectional view of a solder pad 100 in accordance with another embodiment of the present invention is shown. The solder pad 100 is formed on a substrate 102 and includes a plurality of voids 104. A solder mask 106 is formed on the substrate 102 and a portion 108 of the solder pad 100 such that the solder mask 106 fills one or more of the voids 104 in the solder pad 100. Filling of one or more of the voids 104 with solder mask material enhances adhesion of the solder mask 106 to the solder pad 100.

Figure 14:
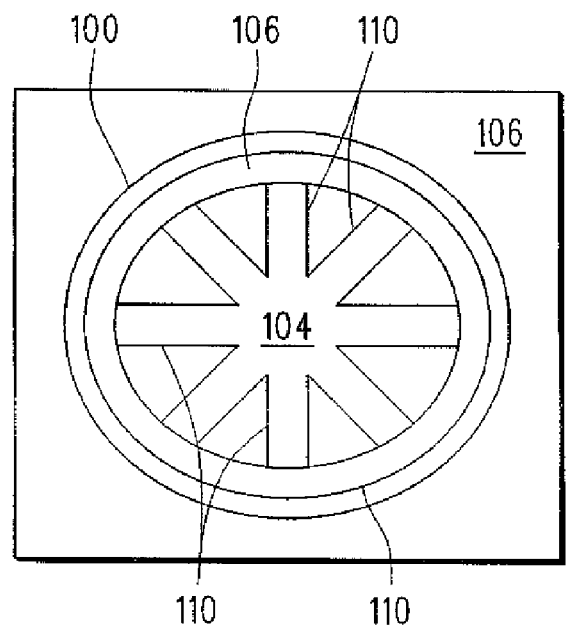
FIG. 14 is an enlarged top plan view of the solder pad of FIG. 13 along a plane X-X.

Referring now to FIG. 14, an enlarged top plan view of the solder pad 100 along a plane X-X in FIG. 13 is shown. As shown in FIG. 14, the voids 104 in the solder pad 100 define a plurality of channels 110 extending across a surface of the solder pad 100. In the embodiment shown, the channels 110 are defined in a radial pattern and thus intersect at a center of the solder pad 100.

Figure 15:
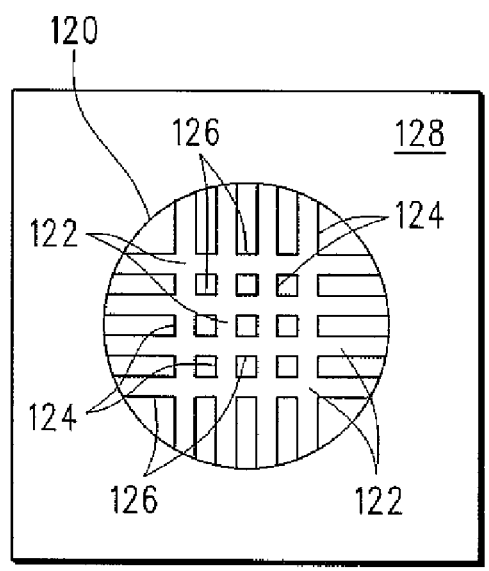
FIG. 15 is an enlarged top plan view of a solder pad in accordance with one embodiment of the present invention.

Referring now to FIG. 14, an enlarged, top plan view of a solder pad 120 in accordance with an embodiment of the present invention is shown. The solder pad 120 includes a plurality of voids 122 formed therein. The voids 122 define a plurality of channels 124 and 126 extending across a surface of the solder pad 120. A solder mask 128 is formed over a portion of the solder pad 120. As shown in FIG. 15, the channels 124 and 126 are defined by a plurality of lines: a first set of substantially parallel lines 124 and a second set of substantially parallel lines 126. In the embodiment shown, the first and second sets of lines 124 and 126 intersect.

Figure 16:
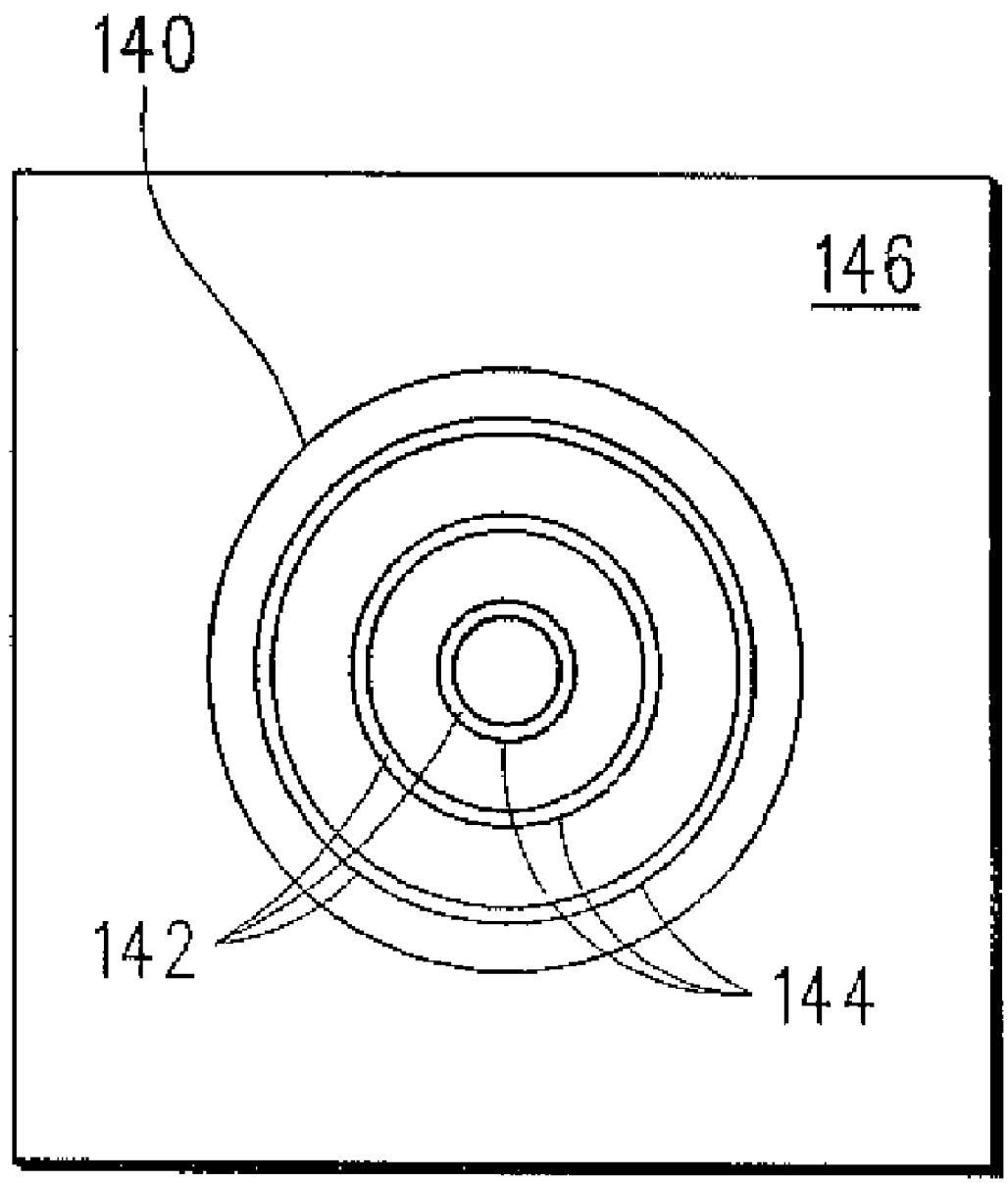
FIG. 16 is an enlarged top plan view of a solder pad in accordance with another embodiment of the present invention.

Referring now to FIG. 16, an enlarged top plan view of a solder pad 140 in accordance with another embodiment of the present invention is shown. The solder pad 140 includes a plurality of voids 142 formed therein, the voids 142 defining a plurality of channels 144 extending across a surface of the solder pad 140. A solder mask 146 is formed over a portion of the solder pad 140. In the embodiment shown, the channels 144 are defined in a concentric pattern.

As is evident from the foregoing discussion, the present invention provides a method of making a solder pad with improved adhesive properties. The provision of voids in the solder pad increases the surface area of contact between the solder pad and solder material (e.g., a solder ball or bump) deposited thereon. The increase in contact area enhances adhesion of the solder material to the solder pad, thereby reducing the incidence of brittle fracture and solder ball drop. Furthermore, the increase in contact area between the solder pad and the solder material enhances thermal and electrical conductivity between electronic components. Additionally, the substantially trapezoidal cross-section of the voids functions as an interlocking mechanism, providing mechanical adhesion between the solder pad and the solder material deposited thereon.

The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. For example, the present invention may be applied to ball grid array (BGA) packages or any solderable surfaces. It is understood, therefore, that this invention is not limited to the particular embodiments disclosed, but covers modifications within the spirit and scope of the present invention as defined by the appended claims.

The invention claimed is:

1. A method of making a solder pad, comprising the steps of:
    providing a substrate having a metal layer formed thereon;
    applying a photoresist to the metal layer;
    patterning the photo resist;
    performing a first etching operation on the metal layer to form a plurality of voids in the metal layer, wherein the voids are formed by half-etching the metal layer and wherein the voids define a plurality of channels extending across a surface of the solder pad, and wherein the channels are defined in one of a radial pattern and a concentric pattern;
    performing a second etching operation on the metal layer to form the solder pad; and
    forming a solder mask on the substrate and a portion of the solder pad.

2. The method of making a solder pad according to claim 1, wherein the voids have a depth of about 0.02 mm.

3. The method of making a solder pad according to claim 2, wherein the voids have a width of about 0.015 mm.

4. The method of making a solder pad according to claim 1, wherein the voids have a substantially trapezoidal cross-section.

5. The method of making a solder pad according to claim 4, wherein the voids are formed by over-etching the metal layer.

6. The method of making a solder pad according to claim 1, wherein the substrate is a bismaleimide-triazine (BT) substrate.

7. The method of making a solder pad according to claim 1, wherein the metal layer comprises copper (Cu)

8. The method of making a solder pad according to claim 1, wherein the step of patterning the photo resist comprises exposing the photo resist through a photo mask.

9. The method of making a solder pad according to claim 8, wherein the step of patterning the photo resist further comprises developing the photo resist.

10. The method of making a solder pad according to claim 1, further comprising removing the photoresist from the metal layer after the etching operations.

11. The method of making a solder pad according to claim 1, wherein the solder mask fills one or more of the voids.

12. A solder pad made in accordance with the method of claim 1.

13. A method of making a solder pad, comprising the steps of:
provide a substrate having a metal layer formed thereon;
applying a photoresist to the metal layer;
patterning the photo resist;
performing a first etching operation on the metal layer to form a plurality of voids in the metal layer, wherein the voids are formed by half-etching the metal layer such that the voids define a plurality of channels extending across a surface of the solder pad, and wherein the channels are defined by a plurality of lines;
performing a second etching operation on the metal layer to form the solder pad; and
forming a solder mask on the substrate and a portion of the solder pad.

14. A method of making a solder pad, comprising the steps of:
providing a substrate having a metal layer formed thereon;
applying a photoresist to the metal layer;
patterning the photo resist;
performing a first etching operation on the metal layer to form a plurality of voids in the metal layer, wherein the voids are formed by half-etching the metal layer such that the voids define a plurality of channels extending across a surface of the solder pad, and wherein the channels are defined by a plurality of lines and wherein one or more of the lines intersect;
performing a second etching operation on the metal layer to form the solder pad; and
forming a solder mask on the substrate and a portion of the solder pad.

* * * * *